(12) United States Patent
Ke et al.

(10) Patent No.: US 7,358,177 B2
(45) Date of Patent: Apr. 15, 2008

(54) FABRICATION METHOD OF UNDER BUMP METALLURGY STRUCTURE

(75) Inventors: Chun-Chi Ke, Taichung (TW); Chien-Ping Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 210 days.

(21) Appl. No.: 11/190,271

(22) Filed: Jul. 26, 2005

(65) Prior Publication Data
US 2006/0252245 A1 Nov. 9, 2006

(30) Foreign Application Priority Data
May 4, 2005 (TW) .............................. 94114356 A

(51) Int. Cl.
*H01L 21/44* (2006.01)
(52) U.S. Cl. .................... 438/613; 438/612; 438/614; 257/E21.508
(58) Field of Classification Search ............... 438/612, 438/613, 614, 615; 257/E21.508
See application file for complete search history.

(56) References Cited

U.S. PATENT DOCUMENTS

| 5,137,845 A | 8/1992 | Lechon et al. ............... 437/183 |
|---|---|---|
| 5,508,229 A | 4/1996 | Baker .......................... 437/183 |
| 5,773,359 A | 6/1998 | Mitchell et al. ............. 438/614 |
| 7,183,192 B2 * | 2/2007 | Park et al. .................... 438/614 |
| 2002/0121692 A1 * | 9/2002 | Lee et al. ..................... 257/737 |
| 2002/0127836 A1 * | 9/2002 | Lin et al. ..................... 438/612 |
| 2005/0014355 A1 * | 1/2005 | Chan et al. .................. 438/613 |

* cited by examiner

*Primary Examiner*—Michael S. Lebentritt
*Assistant Examiner*—Seahvosh J Nikmanesh
(74) *Attorney, Agent, or Firm*—Sawyer Law Group LLP

(57) ABSTRACT

A fabrication method of under bump metallurgy (UBM) structure is provided. A blocking layer is applied over a surface of a semiconductor element formed with at least one bond pad and a passivation layer thereon. The passivation layer covers the semiconductor element and exposes the bond pad, and the blocking layer covers the bond pad and the passivation layer. The blocking layer is formed with at least one opening at a position corresponding to the bond pad. Metallic layers are formed on a surface of the blocking layer and at the opening. The metallic layers are patterned to form a UBM structure at the opening corresponding to the bond pad. Then the blocking layer is removed. The blocking layer can separate the metallic layers for forming the UBM structure from the passivation layer to prevent metallic residues of the UBM structure from being left on the passivation layer.

13 Claims, 4 Drawing Sheets

FABRICATION METHOD OF UNDER BUMP METALLURGY STRUCTURE

CROSS-REFERENCE TO RELATED APPLICATIONS

Under 35 U.S.C. §119e, this application claims foreign priority to Taiwanese Patent Application Number 941143565 filed May 4, 2005, all of which is incorporated herein by reference, and all of which are assigned to the assignee of the present invention.

FIELD OF THE INVENTION

The present invention relates to fabrication methods of under bump metallurgy (UBM) structures, and more particularly, to a method for fabricating a UBM structure to enhance reliability of the UBM structure.

BACKGROUND OF THE INVENTION

Flip-chip semiconductor packaging technology is an advanced packaging technology, which primarily differs from conventional wire bonding packaging technology in that, a semiconductor chip to be packaged is mounted on a substrate in a face-down manner with a front surface of the semiconductor chip facing the substrate, and the semiconductor chip is electrically connected to the substrate by a plurality of bumps. As bonding wires occupying relatively more space are not needed for electrically connecting the semiconductor chip to the substrate in the flip-chip package structure, the entire package structure becomes lighter, thinner and smaller in profile.

Referring to FIG. 1, for bonding a bump 13 to a semiconductor chip 10, an under bump metallurgy (UBM) structure 12 is firstly formed on a bond pad 100 of the semiconductor chip 10. The UBM structure 12 comprises a metallic adhesive layer 12a forming on the bond pad 100, a barrier layer 12b for preventing diffusion, and a solder wettable layer 12c for connecting the bump 13. The UBM structure 12 provides functions such as bump connection, diffusion barrier, proper adhesion and so on between the bump 13 and the bond pad 100 of the semiconductor chip 10, such that a solder material can be applied to the UBM structure 12 and is then subjected to a reflow process to form the required bump 13.

The UBM structure usually comprises titanium-copper-nickel (Ti—Cu—Ni) metallic layers, and can be fabricated by for example sputtering, evaporation, plating and so on. The related prior arts to fabrication of the UBM structure include U.S. Pat. Nos. 5,137,845, 5,508,229, 5,773,359, etc.

A passivation layer 11 is applied on a surface of the semiconductor chip 10 having the bond pad 100 and is generally made of a polyimide material. Due to strong adhesion between the titanium metallic layer of the UBM structure 12 and the polyimide passivation layer 11, it usually occurs that during etching the metallic layers away from an area of the polyimide passivation layer 11 outside a predetermined bumping area, the titanium metallic layer cannot be completely removed from a surface of the polyimide passivation layer 11. As a result, residues of the titanium metallic layer are left on the passivation layer 11 of the semiconductor chip 10, and cause a problem of electrical leakage between bumping areas during chip operation after completing the flip-chip connection between the semiconductor chip and the substrate, thereby affecting electrical functions of the entire package.

FIG. 2 is a cross-sectional view showing electrically connecting the semiconductor chip 10 with the bump 13 to a substrate 20 by a flip-chip method. As described above, since the metallic adhesive layer (the titanium metallic layer) of the UBM structure 12 has strong adhesion with the polyimide passivation layer 11 and is difficult to be removed, not only the titanium metallic layer is formed at a position corresponding to the bond pad 100 of the semiconductor chip 10 but also residues 120 of the titanium metallic layer are left on the passivation layer 11 of the semiconductor chip 10. In such case, during a subsequent flip-chip underfilling process for filling an underfill material 21 between the semiconductor chip 10 and the substrate 20, delamination between the underfill material 21 and the semiconductor chip 10 and cracks of the bump 13 are caused, thereby adversely affecting the product reliability.

In response to the requirements of being light, thin and small in profile for various current electronic devices, there has been developed a packaging technology for directly electrically connecting a chip to an external device such as a printed circuit board and so on without using a chip carrier. For example, as to the wafer level chip scale packaging (WLCSP) technology, a redistribution layer (RDL) is formed on an active surface of a semiconductor wafer and redistributes electrical contacts of the wafer to proper positions, and then connection pads and UBM structures are formed on the proper positions to be electrically connected to the electrical contacts. Therefore, bumps can be implanted on the UBM structures, such that when the wafer is subsequently singulated to form single chips, the chips can be electrically connected to an external device such as a printed circuit board and so on by the bumps. However, if a bottom metallic layer of the UBM structure is a titanium metallic layer and a passivation layer applied on the chip is a polyimide layer, the foregoing problem of having residues of the titanium metallic layer is still caused.

Accordingly, the problem to be solved here is to provide a fabrication method of UBM structure, which can prevent residues of a bottom metallic layer of the UBM structure from being left on a passivation layer and thereby avoid unsatisfactory electrical functions and interface delamination.

SUMMARY OF THE INVENTION

In light of the drawbacks of the conventional technology, an objective of the present invention is to provide a fabrication method of under bump metallurgy (UBM) structure, which effectively prevents material residues of a UBM structure from being left on a passivation layer of a semiconductor element.

Another objective of the present invention is to provide a fabrication method of UBM structure, which avoids unsatisfactory product reliability and electrical functions of a semiconductor element caused by titanium residues of a UBM structure being left on a polyimide passivation layer.

Still another objective of the present invention is to provide a fabrication method of UBM structure, which avoids delamination during a flip-chip underfilling process.

A further objective of the present invention is to provide a fabrication method of UBM structure, which effectively prevents electrical leakage resulted from residues of a bottom metal of a UBM structure being left on a passivation layer.

In order to attain the above and other objectives, the fabrication method of UBM structure in the present invention comprises the steps of: applying a blocking layer over a surface of a semiconductor element formed with at least one bond pad and a passivation layer thereon, wherein the passivation layer covers the semiconductor element and exposes the bond pad, and the blocking layer covers the bond pad and the passivation layer; forming at least one opening in the blocking layer at a position corresponding to the bond pad; forming metallic layers on a surface of the blocking layer and at the opening of the blocking layer, and patterning the metallic layers to form a UBM structure at the opening corresponding to the bond pad; and removing the blocking layer. The blocking layer can be made of aluminum, copper, or nickel/vanadium, etc. During the process of forming the UBM structure, the blocking layer prevents the UBM structure from being in contact with areas other than the bond pad of the semiconductor element so as to avoid residues of a bottom metallic layer (e.g. a titanium metallic layer) used in the UBM structure being left on the passivation layer (e.g. a polyimide layer) of the semiconductor element.

In other words, the fabrication method of UBM structure in the present invention is to in advance apply the blocking layer at areas other than the bond pad of the semiconductor element during the process of forming the UBM structure on the semiconductor element, wherein the blocking layer has good adhesion with the passivation layer and can be removed by etching without having residues left on the passivation layer. The blocking layer can separate a portion of the metallic layers in the UBM structure, which may easily form residues on the passivation layer, from the passivation layer, and after the UBM structure is formed on the bond pad, the blocking layer is removed from the passivation layer. Accordingly, this can prevent material residues of the UBM structure from being left on the areas other than the bond pad of the semiconductor element, such that unsatisfactory reliability and delamination during a subsequent underfilling process caused by titanium residues of the UBM structure being left on the polyimide layer are both avoided.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

FIGS. 3A to 3E are cross-sectional views showing steps of a fabrication method of under bump metallurgy (UBM) structure according to the present invention.

Figure 1:
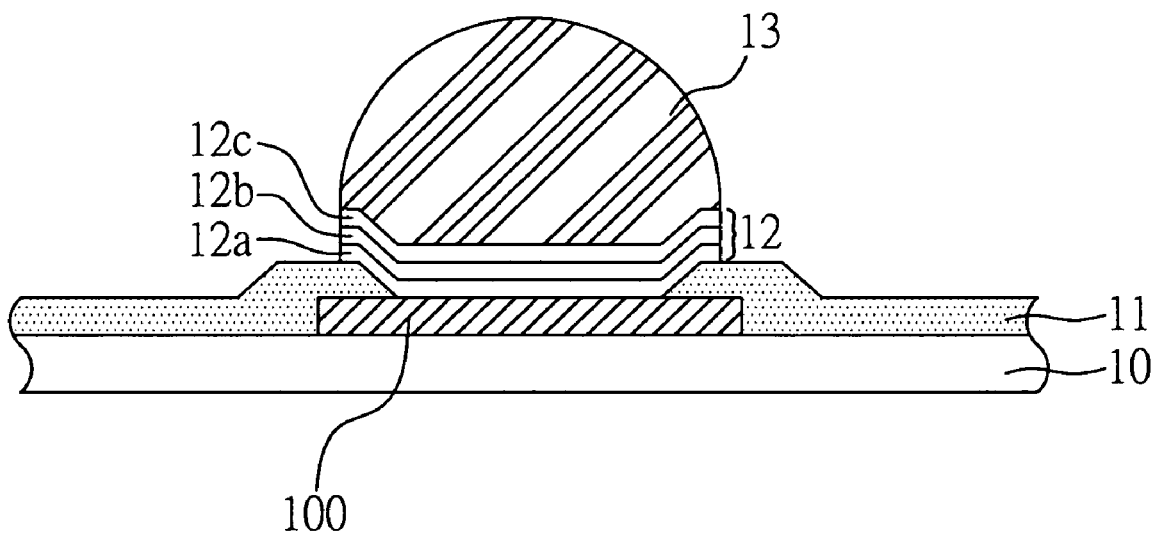
FIG. 1 (PRIOR ART) is a cross-sectional view showing a conventional semiconductor chip having a UBM structure and a bump.
Figure 2:
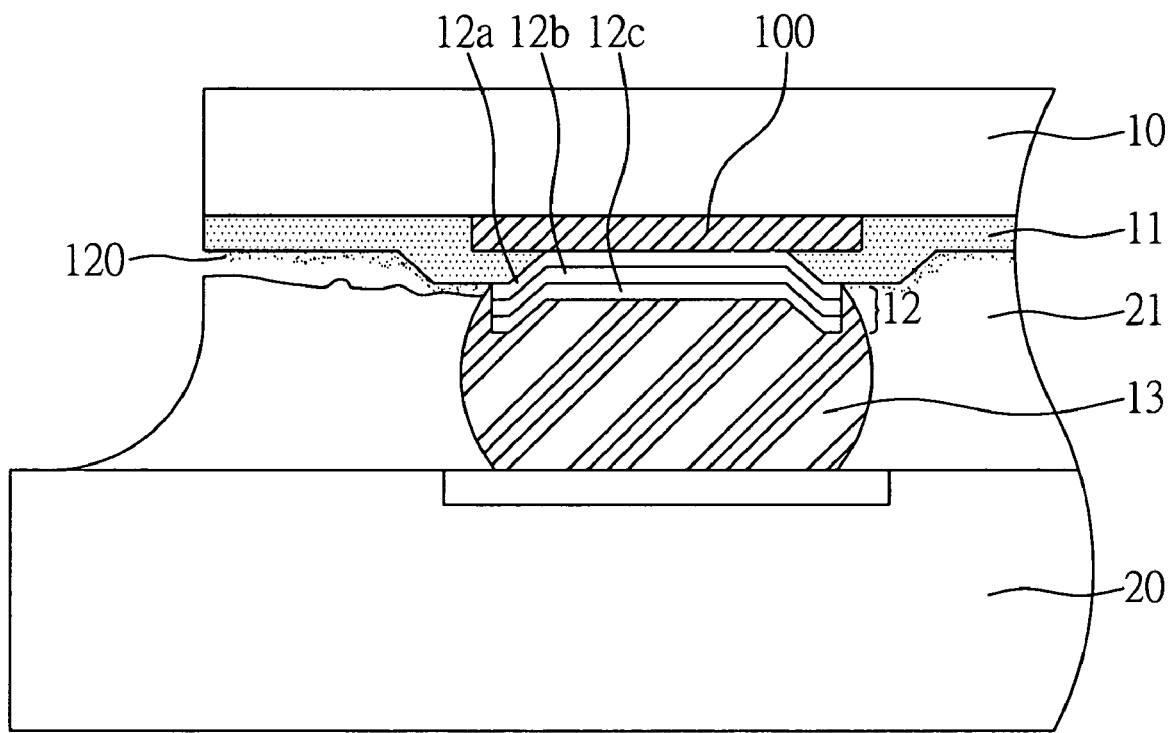
FIG. 2 (PRIOR ART) is a cross-sectional view showing delamination during a flip-chip underfilling process caused by residues of a bottom metallic layer of the UBM structure being left on a passivation layer of the semiconductor chip.
Figure 3A:
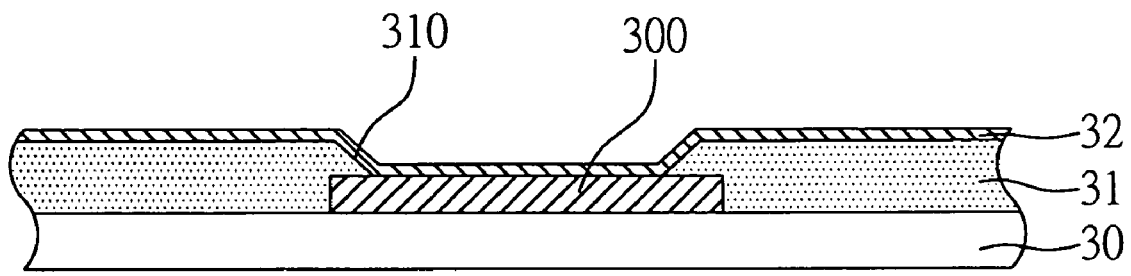
FIGS. 3A to 3E are cross-sectional views showing steps of a fabrication method of UBM structure according to the present invention.

As shown in FIG. 3A, firstly a semiconductor element 30 is provided, wherein at least one bond pad 300 is formed on a surface of the semiconductor element 30, and a passivation layer 31 is applied on the surface of the semiconductor element 30 and is formed with at least one opening 310 for exposing the bond pad 300. The semiconductor element 30 can be used as a semiconductor package substrate or a general printed circuit board for assembling electronic elements in a second phase, and is most preferably used as a flip-chip semiconductor chip or a wafer. The bond pad 300 serves as an output/input connection of internal circuits of the semiconductor element 30. The passivation layer 31 is a dielectric layer and is generally made of polyimide or the like, which covers the surface of the semiconductor element 30 and prevents the semiconductor element 30 from being contaminated and damaged by an external environment. The bond pad 300 exposed via the opening 310 of the passivation layer 31 can be a copper pad or an aluminum pad.

Then, a blocking layer 32 is formed on the semiconductor element 30 to cover the passivation layer 31 and the bond pad 300 by a physical or chemical deposition process such as sputtering, evaporation, plating, etc. The blocking layer 32 can be made of a material that has good adhesion with the bond pad 300 and the passivation layer 31 and is relatively more easily removed from the passivation layer 31 than a bottom metallic material (such as titanium) used in metallic layers of a UBM structure; the material for the blocking layer 32 is for example, aluminum, copper, or nickel/vanadium, etc.

Figure 3B:
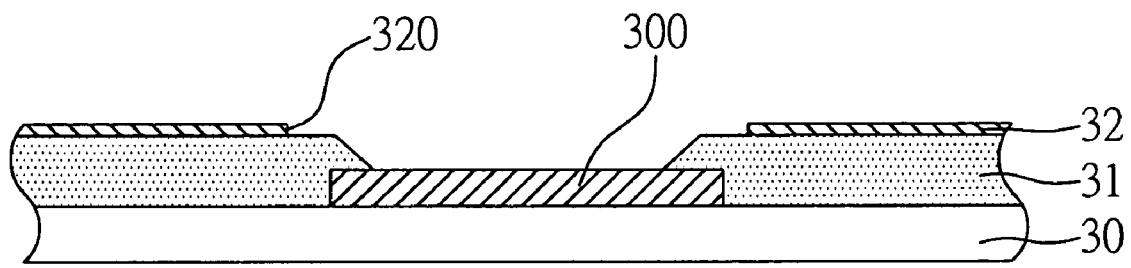

As shown in FIG. 3B, the blocking layer 32 is formed with at least one opening 320 at a position corresponding to the bond pad 300 by for example an etching process. The size of the opening 320 of the blocking layer 32 can be equal to or slightly smaller than the area of a UBM structure to be formed subsequently.

Figure 3C:
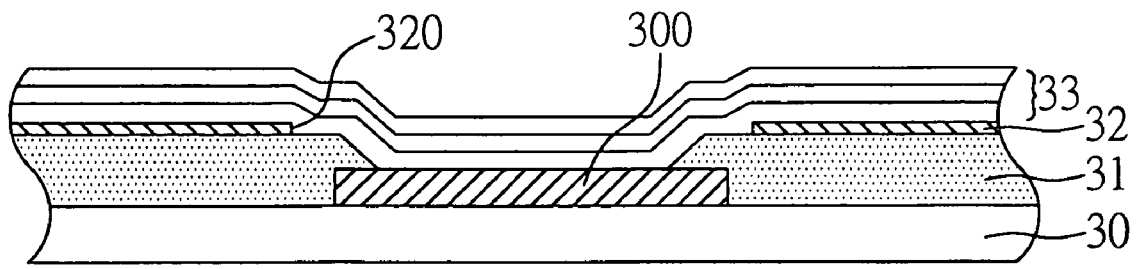

As shown in FIG. 3C, metallic layers 33 are formed on a surface of the blocking layer 32 and at the opening 320 of the blocking layer 32 by a physical or chemical deposition process such as sputtering, evaporation, plating, etc. The number and types of the metallic layers 33 for forming the UBM structure can be modified according to requirements in practical implementation, so as to allow a subsequent bump to be mounted on the metallic layers 33 effectively. The metallic layers 33 generally include a metallic adhesive layer, a barrier layer and a solder wettable layer, for example, the metallic layers 33 comprise a structure of titanium-copper-nickel (Ti—Cu—Ni) three layers as shown in FIG. 3C.

Figure 3D:
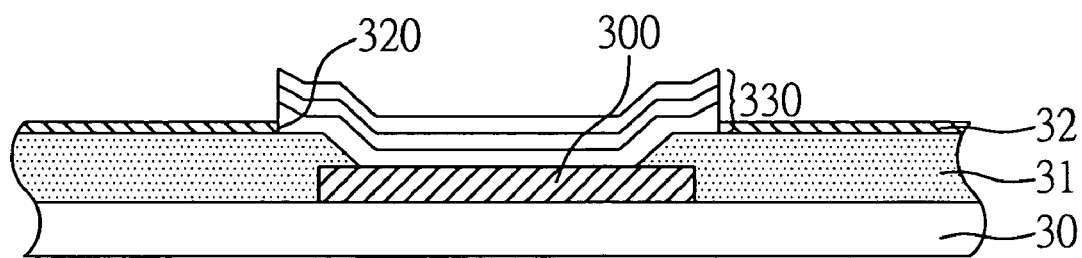

As shown in FIG. 3D, the metallic layers 33 are patterned to form a UBM 330 structure at the opening 320 of the blocking layer 32 corresponding to the bond pad 300. The patterning process of the metallic layers 33 comprises firstly, applying a resist layer such as photoresist (not shown) on the metallic layers 33; then, forming a plurality of openings in the resist layer by exposing, developing and so on to expose portions of the metallic layers 33 via the openings; and subsequently, performing an etching process to pattern the metallic layers 33 so as to define the UBM structure 330 at the opening 320 of the blocking layer 32.

Figure 3E:
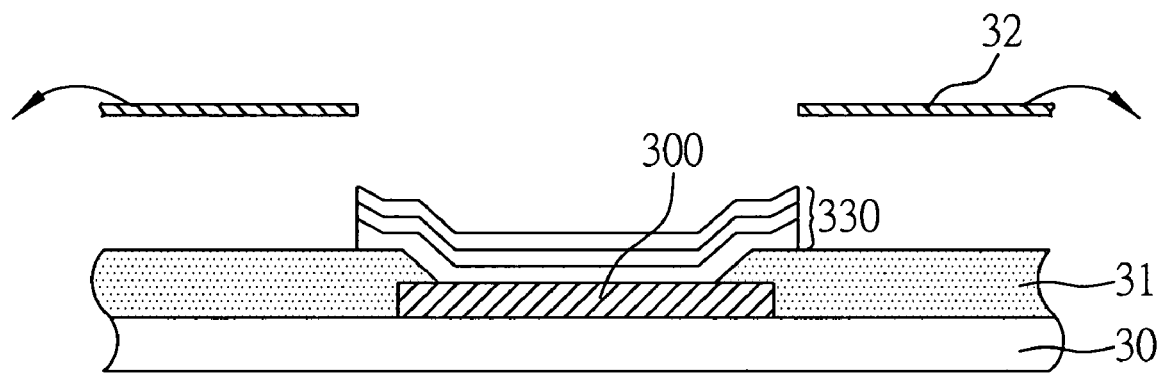

As shown in FIG. 3E, the blocking layer 32 is then removed by for example an etching process to expose the UBM structure 330 completely, such that there is no metallic residues (such as residues of the titanium metallic layer) of the UBM structure 330 left on the passivation layer 31 (such as a polyimide layer) of the semiconductor element 30.

Therefore, by the fabrication method of UBM structure according to the present invention, during the process of forming the UBM structure on the semiconductor element, the blocking layer is in advance applied at areas other than the bond pad of the semiconductor element, wherein the blocking layer has good adhesion with the passivation layer and can be removed by etching without having residues left on the passivation layer. The blocking layer can separate a portion of the metallic layers in the UBM structure, which may easily form residues on the passivation layer, from the passivation layer, and after the UBM structure is formed on the bond pad, the blocking layer is removed from the passivation layer. Accordingly, this can prevent material residues of the UBM structure from being left on the areas other than the bond pad of the semiconductor element, such that unsatisfactory reliability and delamination during a subsequent underfilling process caused by titanium residues of the UBM structure being left on the polyimide layer are both avoided.

The present invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of under bump metallurgy (UBM) structure, comprising:
    applying a blocking layer over a surface of a semiconductor element formed with at least one bond pad and a passivation layer thereon, wherein the passivation layer covers the semiconductor element and exposes the bond pad, and the blocking layer covers the bond pad and the passivation layer;
    forming at least one opening in the blocking layer at a position corresponding to the bond pad;
    forming metallic layers on a surface of the blocking layer and at the opening of the blocking layer, and patterning the metallic layers to form a UBM structure at the opening corresponding to the bond pad; and
    removing the blocking layer.

2. The fabrication method of UBM structure of claim 1, wherein the semiconductor element is one of a semiconductor chip, a wafer, a semiconductor package substrate, and a circuit board.

3. The fabrication method of UBM structure of claim 1, wherein the passivation layer is a dielectric layer.

4. The fabrication method of UBM structure of claim 3, wherein the passivation layer is a polyimide layer.

5. The fabrication method of UBM structure of claim 1, wherein the blocking layer is made of one of aluminum, copper, and nickel/vanadium.

6. The fabrication method of UBM structure of claim 1, wherein the bond pad is a copper pad or an aluminum pad.

7. The fabrication method of UBM structure of claim 1, wherein the blocking layer and the metallic layers are formed by a physical or chemical deposition process including sputtering, evaporation or plating.

8. The fabrication method of UBM structure of claim 1, wherein a size of the opening of the blocking layer is equal to an area of the UBM structure.

9. The fabrication method of UBM structure of claim 1, wherein a size of the opening of the blocking layer is slightly smaller than an area of the UBM structure.

10. The fabrication method of UBM structure of claim 1, wherein the opening of the blocking layer is formed by an etching process.

11. The fabrication method of UBM structure of claim 1, wherein the UBM structure includes a metallic adhesive layer, a barrier layer and a solder wettable layer.

12. The fabrication method of UBM structure of claim 11, wherein the UBM structure includes titanium-copper-nickel (Ti—Cu—Ni) metallic layers.

13. The fabrication method of UBM structure of claim 1, wherein a bottom one of the metallic layers of the UBM structure comprises a titanium metallic layer.

* * * * *